(12) United States Patent
Lien et al.

(10) Patent No.: US 9,287,154 B2
(45) Date of Patent: Mar. 15, 2016

(54) UV CURING SYSTEM FOR SEMICONDUCTORS

(75) Inventors: Ming Huei Lien, New Taipei (TW); Chia-Ho Chen, Zhubei (TW); Shu-Fen Wu, Yilan (TW); Chih-Tsung Lee, Hisnchu (TW); You-Hua Chou, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/486,025

(22) Filed: Jun. 1, 2012

(65) Prior Publication Data

US 2013/0320235 A1    Dec. 5, 2013

(51) Int. Cl.
| | | |
|---|---|---|
| H01L 21/677 | (2006.01) | |
| H01L 21/68 | (2006.01) | |
| H01L 21/67 | (2006.01) | |
| H01L 21/3105 | (2006.01) | |

(52) U.S. Cl.
CPC ........ *H01L 21/6776* (2013.01); *H01L 21/3105* (2013.01); *H01L 21/67115* (2013.01)

(58) Field of Classification Search
USPC ............................................ 250/492.1, 492.2
See application file for complete search history.

(56) References Cited

U.S. PATENT DOCUMENTS

| | | | |
|---|---|---|---|
| 4,670,365 A * | 6/1987 | Yoshihara | 430/5 |
| 6,756,085 B2 | 6/2004 | Waldfried et al. | |
| 7,314,828 B2 | 1/2008 | Lin et al. | |
| 7,334,933 B1 * | 2/2008 | Simon | 362/615 |
| 7,482,265 B2 | 1/2009 | Chen et al. | |
| 7,566,891 B2 | 7/2009 | Rocha-Alvarez et al. | |
| 7,589,336 B2 | 9/2009 | Kaszuba et al. | |
| 7,763,869 B2 * | 7/2010 | Matsushita et al. | 250/504 R |
| 7,868,304 B2 * | 1/2011 | Bakker | G03F 7/70175 250/492.1 |
| 7,935,940 B1 | 5/2011 | Smargiassi | |
| 2004/0262540 A1 * | 12/2004 | Nagaseki et al. | 250/492.1 |

(Continued)

FOREIGN PATENT DOCUMENTS

| | | |
|---|---|---|
| CN | 101086958 A | 12/2007 |
| EP | 0151910 B1 * | 4/1992 |

(Continued)

OTHER PUBLICATIONS

Official Action issued Sep. 4, 2013, in counterpart Korean Patent Application No. 10-2012-0112993.

*Primary Examiner* — Robert Kim
*Assistant Examiner* — James Choi
(74) *Attorney, Agent, or Firm* — Duane Morris LLP

(57) ABSTRACT

Embodiments of an ultraviolet (UV) curing system for treating a semiconductor substrate such as a wafer are disclosed. The curing system generally includes a processing chamber, a wafer support for holding a wafer in the chamber, a UV radiation source disposed above the chamber, and a UV transparent window interspersed between the radiation source and wafer support. In one embodiment, the wafer support is provided by a belt conveyor operable to transport wafers through the chamber during UV curing. In another embodiment, the UV radiation source is a movable lamp unit that travels across the top of the chamber for irradiating the wafer. In another embodiment, the UV transparent window includes a UV radiation modifier that reduces the intensity of UV radiation on portions of the wafer positioned below the modifier. Various embodiments enhance wafer curing uniformity by normalizing UV intensity levels on the wafer.

20 Claims, 14 Drawing Sheets

(56) References Cited

U.S. PATENT DOCUMENTS

| | | | |
|---|---|---|---|
| 2006/0249175 A1* | 11/2006 | Nowak | C23C 16/4405 134/1 |
| 2009/0093134 A1 | 4/2009 | Matsushita et al. | |
| 2011/0097902 A1 | 4/2011 | Singh et al. | |
| 2012/0132618 A1* | 5/2012 | Baluja et al. | 216/66 |
| 2014/0231671 A1* | 8/2014 | Lu | B05D 3/067 250/455.11 |

FOREIGN PATENT DOCUMENTS

| | | | |
|---|---|---|---|
| EP | 1140364 B1 | * | 7/2006 |
| JP | H09251936 A | | 9/1997 |
| JP | 11264902 A | * | 9/1999 |
| JP | 2001060548 A | * | 3/2001 |
| JP | 2001217222 A | * | 8/2001 |
| JP | 2011005458 | | 1/2011 |
| KR | 20120061731 | | 6/2012 |

* cited by examiner

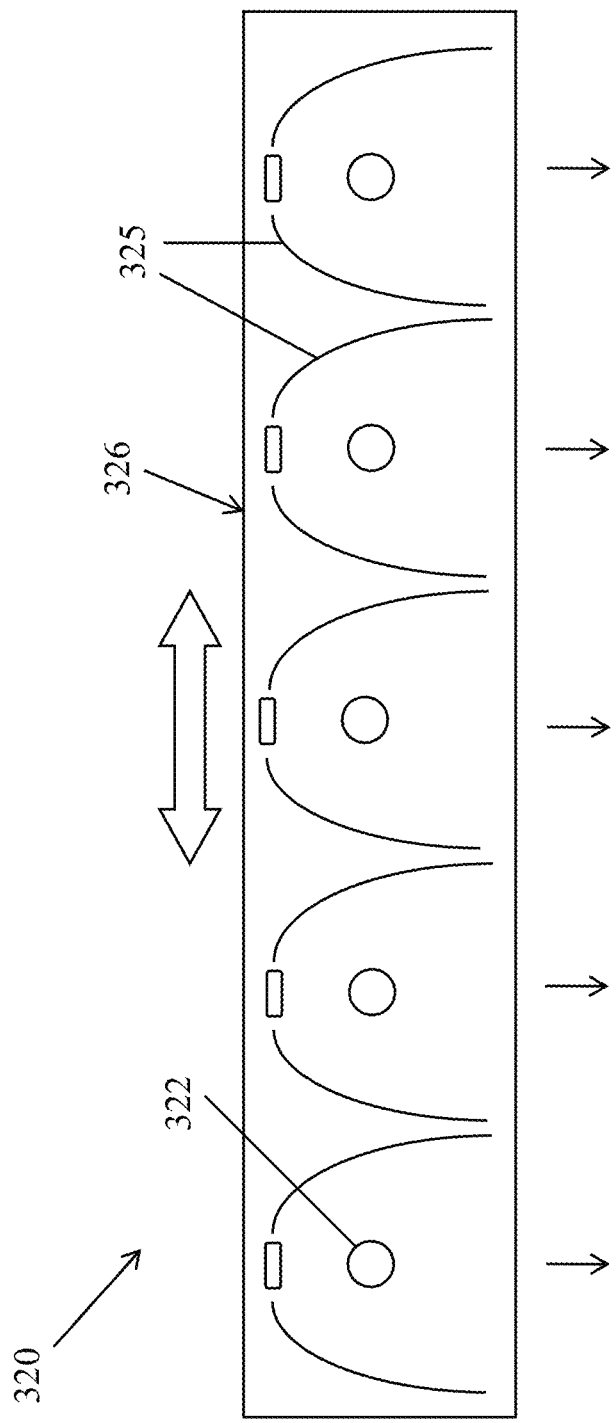
FIG. 7.1

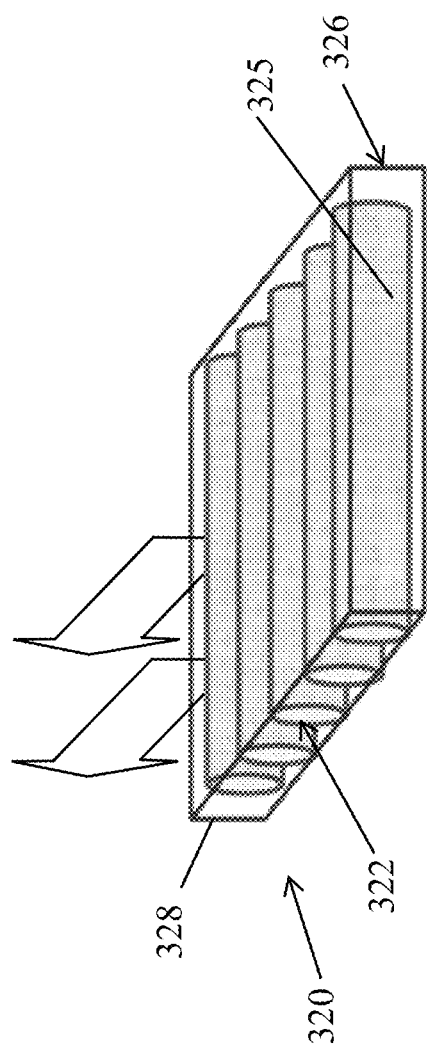
FIG. 7.2

UV CURING SYSTEM FOR SEMICONDUCTORS

FIELD

The present disclosure generally relates to semiconductor fabrication processes, and more particularly to ultraviolet (UV) curing systems and associated methods suitable for curing semiconductor layers or films on a wafer.

BACKGROUND

Low-k dielectric insulating materials are used in the fabrication of semiconductor devices as a means to reduce resistance capacitance (RC) delay time which inhibits device performance speed and increases power consumption. Low-k dielectrics are used, for example, as inter-metal dielectrics (IMD) and inter-layer dielectrics (ILD) between conductive traces to improve semiconductor device performance as such devices and circuits therein continue to shrink in size with advances in fabrication technology. Low-K materials are generally considered those with dielectric constants less than 3.

Low-k dielectric films may be deposited on a wafer by various CVD (chemical vapor deposition) or spin-on processes. These dielectric materials are cured after deposition by irradiation with UV light for many reasons including improving and/or restoring the physical properties to the film material such as increasing elastic modulus or hardness to improve mechanical strength for higher packaging yields and/or to better withstand post-film deposition processes such as etching, chemical cleaning, CMP (chemical mechanical polishing), wire bonding, etc. In addition, UV curing is used to repair damage to the film caused by chemicals such as fluorine and nitrogen, and to restore the low k properties of the film which may increase during some post-film deposition processes.

During UV curing of low-k dielectric films, it is desirable to maintain uniform UV curing intensity over the entire surface of the wafer to avoid problems such as film shrinkage at portions of the wafer that may be disproportionately exposed to greater levels of irradiation which may result in variability in device performance. Existing UV curing apparatus arrangements sometimes result in higher localized UV irradiation intensity regions on the wafer, which may occur at the center of the wafer and/or in one or more other isolated regions. The differential wafer irradiation profile may be attributed to the UV lamp arrangement and/or curing process used. As wafer sizes move from 300 mm to 450 mm wafers, the non-uniformity problems can be expected to worsen.

Improved UV curing systems and methods are desired.

BRIEF DESCRIPTION OF THE DRAWINGS

The features of the embodiments will be described with reference to the following drawings where like elements are labeled similarly, and in which:

FIG. 7.1 is a cross-sectional view thereof;

FIG. 7.2 is a perspective view thereof;

Figure 1:
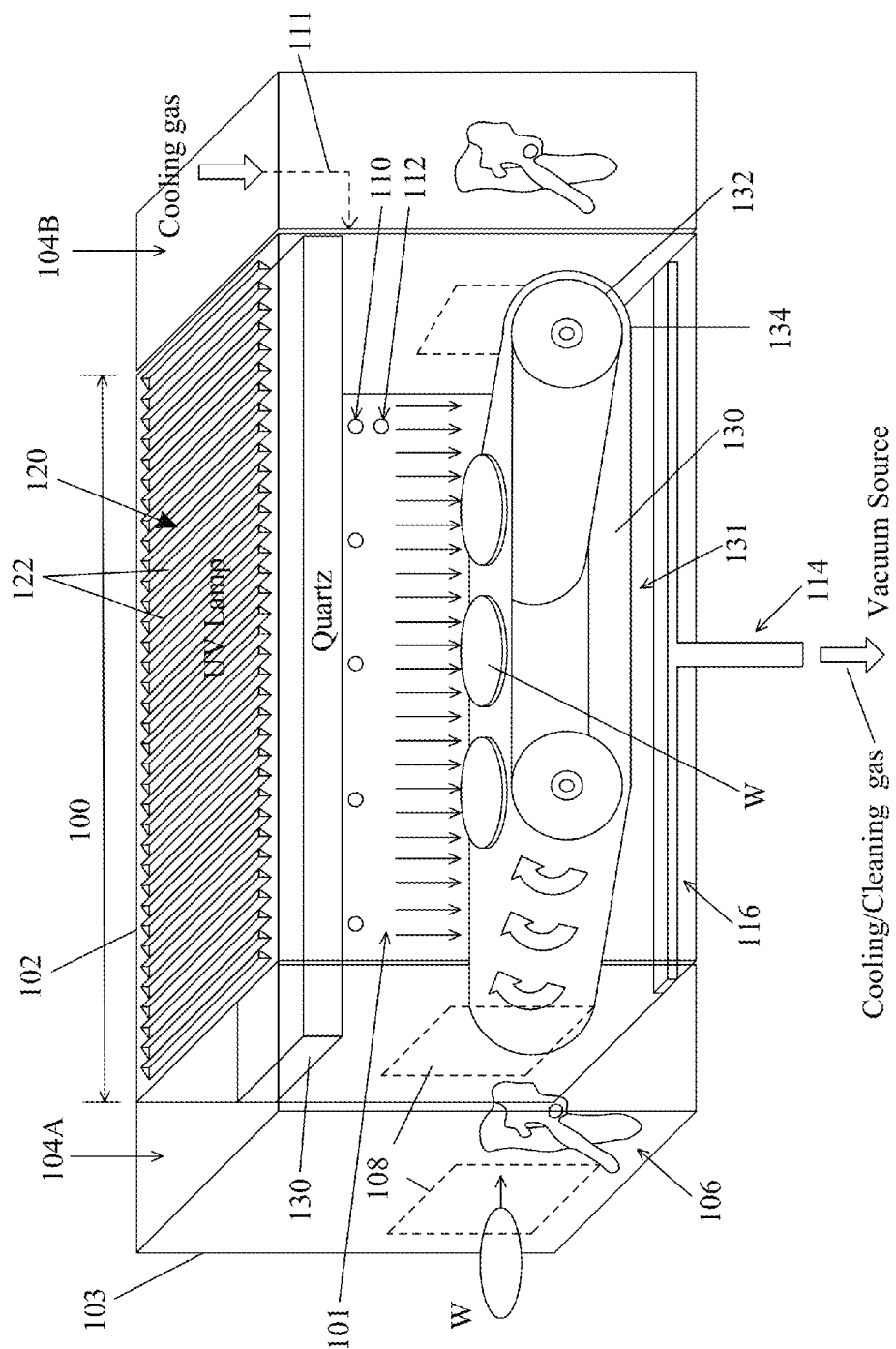
FIG. 1 is a perspective diagram of a first embodiment of a UV curing system according to the present disclosure.

All drawings are schematic and are not drawn to scale.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected," "interconnected," "coupled," "attached," etc. refer to a relationship wherein structures are secured or attached to one another either directly or indirectly through intervening structures, as well as both movable or rigid attachments or relationships, unless expressly described otherwise.

First Embodiment

FIG. 1 is a schematic diagram of an exemplary first embodiment of a UV curing system according to the present disclosure. The curing system includes a UV curing tool or oven 100 having an enclosure 102 defining a UV irradiation processing chamber 101 therein. A wafer load lock chamber 104A, 104B is disposed on either end of the oven 100 for loading and unloading wafers W from the processing chamber 101. Load lock chamber 104A is an entry load lock chamber and load lock chamber 104B is an exit load lock chamber.

Figure 14:
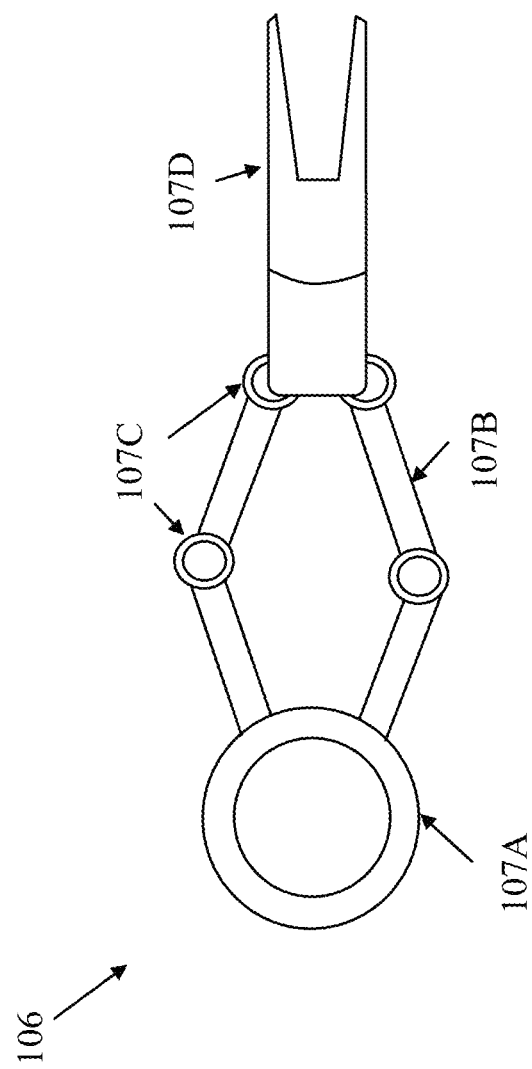
FIG. 14 is a top view of one possible embodiment of a wafer handling robot of FIG. 1.

Each load lock chamber 104A, 104B includes an outer housing 103 provided with two opposing access doors 108; one outer access door 108 to atmosphere for receiving wafers W from an external source, and another inner access door to processing chamber 101 for loading wafers from the load lock chamber into the processing chamber. In some possible embodiments, an automated material handling system (AMHS) may be used to deliver a wafer cassette or carrier such as a FOUP (front opening unified pod) holding a plurality of unprocessed wafers to the entry load lock chamber 104A. Another empty wafer carrier may be positioned at exit load lock chamber 104B to receive UV processed wafers. In one embodiment, the inner access doors 108 to curing oven 100 are openable/closeable and include suitable seals that operate to seal the processing chamber 101 to allow a controlled process environment to be established inside curing oven 100. The outer access doors 108 provided in the load lock chamber 104 housing for external access may further be openable/closeable and include suitable seals to allow each load lock chamber to be isolated from the external ambient facility environment. In some embodiments, the externally positioned access doors 108 at may be configured for docking a wafer carrier such as a FOUP which holds multiple wafers. Each load lock chamber 104A, 104B includes a wafer handling robot 106 that is operable to retrieve/receive and load wafers W into processing chamber 101, and to remove the UV cured wafer from the processing chamber at the other end. Wafer handling robots are commercially available. FIG. 14 shows a top view of one of many possible embodiments of a robot 106 including a magnetic floating motor 107A, an extendible and mechanically articulating robotic feed arm 107B including swivel joints 107C, and a wafer grasping blade 107D disposed on an end of the feed arm configured for grasping and releasing a wafer W. Any suitable wafer handling robot may be used.

As shown in FIG. 1, curing oven 100 is tunnel-shaped in some embodiments being in the form of an elongated structure having a greater length than width in the direction of the wafer process flow from the entry load lock chamber 104A (shown at left) to the exit load lock chamber 104B (shown at right). This arrangement advantageously increases the exposure time of the wafers W to the UV light to improve curing performance by producing uniform wafer irradiation and heating.

Advantageously, curing oven 100 is configured to process more than one wafer at a time allowing for mass production and productivity improvements over curing ovens capable of processing a single wafer alone (see, e.g. FIG. 1).

Figure 2:
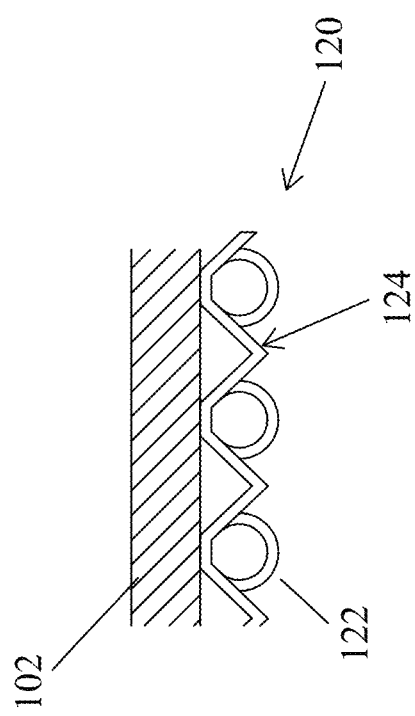
FIG. 2 is a cross-sectional elevation view of an UV lamp unit in the UV curing system of FIG. 1.

With continuing reference to FIG. 1, the UV curing system further includes a UV light source such UV lamp unit 120 comprising an array or plurality of UV lamps 122 that emit UV wavelength radiation. Wafer W is positioned in optical view of lamp unit 120 within processing chamber 101 to receive UV radiation for film curing. FIG. 2 is a cross-sectional elevation view of a portion of lamp unit 120. The lamps 122 may be mounted by appropriate lamp holders which are supported by a portion of the oven enclosure 102. Accordingly, in one embodiment, lamp unit 120 is fixed and stationary in position. Lamp unit 120 is positioned above the processing chamber 101 in the embodiment shown. In some embodiments, reflectors 124 may be provided which are positioned above and include portions extending vertically at least partially in between each of the lamps 122 to reflect the UV light downwards towards the processing chamber 101, thereby enhancing the irradiation and curing of a dielectric film such as a low-K film previously deposited on the wafer W by any suitable means including CVD (chemical vapor deposition) or spin-on. The low-K film may be any type of material including without limitation as examples Black Diamond® from Applied Materials or SiLK® from Dow Chemical.

Reflectors 124 are positioned proximate to lamps 122 to maximize reflection of the UV radiation. Reflectors 124 may have any suitable configuration, and in the exemplary embodiment shown has an undulating angled or zigzag pattern as shown in FIG. 2. Individual lamps 122 are positioned within each recess formed by the angled reflector unit. In other embodiments, the reflectors may be concave shaped wherein an individual lamp 122 is positioned below each of a plurality of concave shaped reflectors similarly to the angle reflector arrangement shown in FIG. 2. The reflectors may be made of any suitable coated or uncoated metal having a reflective surface finish or coating which is operable to reflect UV radiation. In one embodiment, without limitation, the reflectors may be formed of aluminum.

Any suitable type of UV lamps 122 or source may be used including without limitation mercury and excimer lamps, mercury microwave arc lamps, pulsed xenon flash lamps, UV light emitting diodes, etc. In one embodiment, UV lamps 122 are elongated tube-type UV lamps which are arranged in spaced and parallel relationship to each other along the length and longitudinal direction of the curing oven 100 (see FIGS. 1 and 2). Lamps 122 may be powered by any suitable power supply usable to energize the lamps. Lamps 122 may be selected to produce UV radiation having any appropriate wavelength for the process requirements encountered. As an example, without limitation, the UV radiation wavelength used may be in the range from about 193 nm to 500 nm.

In one embodiment, as shown in FIG. 1, the combination of reflectors 124 and lamps 122 produce a UV irradiance pattern (see downwards UV ray arrows) that covers a majority of the moving belt conveyor 131, and more particularly at least the portions of the belt 130 on which the wafers will be emplaced so that all portions of the wafer are irradiated substantially uniformly with relative uniform UV intensity. In some embodiments, the UV irradiance pattern forms a generally rectilinear (e.g. rectangular or square) irradiance illumination profile on the belt 130 that is at least the same size as the belt in some embodiments. At least more than two lamps 122 are provided in various embodiments to form an array of lamps that extends longitudinally over a majority of the length of belt 130. The lamps are arranged with the length of the tube-type lamps being arranged and oriented laterally to extend across the width of the UV curing oven 100 as shown in FIG. 1. This arrangement minimizes the length of the lamps 122 needed for the array.

Referring to FIGS. 1 and 2, a UV transparent window such as quartz window 130 separates and isolates the active wafer processing chamber 101 and UV lamp unit 120. Quartz window 130 is therefore positioned and seated in the curing oven 100 above the wafer W to operatively seal the processing chamber 101 from the ambient environment and UV lamp unit. The window 130 prevents out-gassing from the wafer from reaching and contaminating the UV lamps 122. The quartz window 130 operates to allow UV wavelength radiation from the lamp unit 120 to be transmitted and pass through the window and irradiate a wafer W positioned below the window. In one, the process window may be made of synthetic quartz.

In one embodiment, quartz ($SiO_2$) window 130 in the present UV curing apparatus has a size sufficient to all regions of lamp array.

Curing oven 100 further includes a gas cooling system that supplies an inert gas to processing chamber 101. The cooling gas maintains temperatures in processing chamber 101 to a desired level, which may be below 450 degrees C. in some representative non-limiting embodiments. The cooling gas also serves as a purge gas to help remove various organic compounds or other species outgassed from wafer W during UV processing. In one embodiment, nitrogen ($N_2$) is used as the cooling gas; however, other suitable inert or noble gases may be used. The cooling gas is introduced into the processing chamber 101 through any suitable number and arrangement of inlet conduit(s) 111 from a gas source. The cooling gas is drawn into and removed from the process chamber 101 by an outlet tubing header 116 containing multiple holes connected to an outlet conduit 114. Out-gassing from wafer W during UV curing is removed from processing chamber 101 along with the inert cooling gas through outlet conduit 114.

In some embodiments, outlet conduit 114 may be connected to a vacuum source such as a vacuum pump in which chamber 101 is operated under pressure less than atmospheric. In various embodiments, the processing chamber 101 may be held at a vacuum, atmospheric (<10 ton), or positive pressures.

The UV curing process is sensitive to oxygen (O2) in the processing chamber 101. Accordingly, in some embodiments one or more O2 sensors 112 as shown in FIG. 1 may be provided to monitor O2 levels during the curing process and detect if levels become high enough to present potential processing problems.

Referring again to FIGS. 1 and 2, UV curing oven 100 further includes a belt conveyor 131 configured for moving wafers W through the oven. Belt conveyor 131 includes a belt 130 which is mounted and travels between at least two pulleys 132 in the usual manner. At least one pulley 132 is a driven pulley rotated by a suitable electric motor drive 134 which turns the pulley and drives the belt. The belt conveyor 131 operates to linearly move wafers W through curing oven 100 along its length in a longitudinal direction from the entry load lock chamber 104A to the exit load lock chamber 104B.

Conveyor belt 130 may be made of any suitably structured and type of material capable of being resistant to and withstanding UV radiation, heat within curing oven 100, and corrosion from out-gassing and oven cleaning gas chemistries. In some embodiments, without limitation, a flexible metal wire mesh conveyor belt material may be used which is fabricated from wire or sheets which are woven, knitted, perforated, expanded, or otherwise formed into a flexible belt capable of traveling around pulleys 132. The metal mesh belts include open areas through which cooling gas may flow between the wafers W during processing and cleaning gases when the curing oven 100 is periodically cleaned to remove organic deposits that form inside the oven during processing.

In some embodiments, the material used for a metal wire mesh belt 130 may be aluminum, titanium, steel (including stainless steel), nickel, copper, platinum, metal alloys thereof, or other suitable metals and alloys. In one embodiment, an aluminum or aluminum alloy mesh belt is used. Wire mesh conveyor belting is commercially available.

With continuing reference to FIG. 1, UV curing oven 100 in some embodiments includes a gas cleaning system. During operation, organic material deposits form on the walls, quartz window, and conveyor in the processing chamber 101 during the UV wafer curing. The curing produces out-gassing containing the organic compounds from the wafer and low-K dielectric films thereon. Periodically between UV curing cycles, remote plasma cleaning (RPC) is performed by introducing a cleaning gas such as O2 into the chamber 101 through multiple flow nozzles 110. Reaction of the gas with UV radiation produces by lamp unit 120 produces ozone which removes the organic deposits from within the chamber. The "dirty" cleaning gas stream may be removed from chamber 101 via outlet conduit 114.

The UV curing process performed in curing oven 100 may be conducted at any suitable pressure and temperature. In one embodiment, an operating temperature range within about and including 300 to about and including 410 degree C. is used. In general, temperatures above 410 degree C. are not recommended due to wafer thermal budget and device concern. Operating pressure is within 1-10 Torr in some embodiments for better curing uniformity control.

In some embodiments, operation of the UV curing system and oven 100 may be controlled by a processor-based controller that is operably associated with the oven. Such controllers are well known in the art and function to actuate the UV lamp array, belt conveyor, gas flow, wafer loading/unloading operations, cleaning cycles, etc. To make sure UV lamp array intensity is within control limits, a real time UV intensity monitor system is used in some embodiments to provide feedback to the system. If UV lamp intensity drops to 95%, an alarm system may be provided that will trigger the system or operator to stop production. Within 95%-100% UV intensity, auto tuning of UV lamp power is controlled by a power controller or unit in some embodiments to control power (intensity) to make sure the curing performance is uniform between wafer to wafer.

Figure 3:
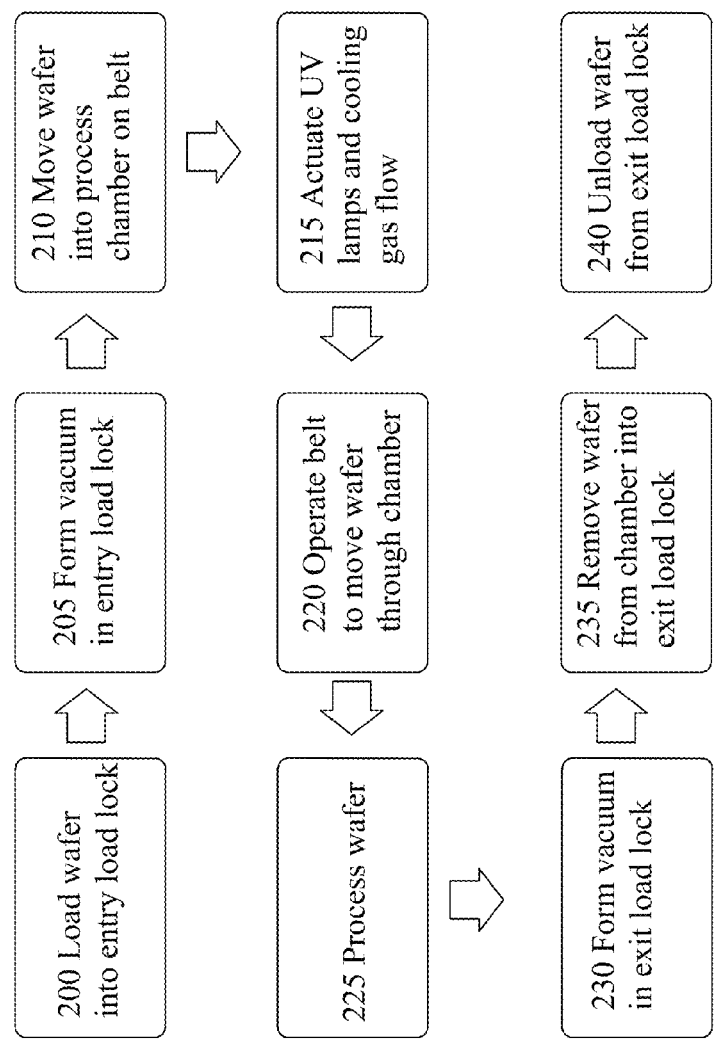
FIG. 3 is a flow chart showing steps in an embodiment of a method for curing a wafer using the curing system of FIG. 1.

An exemplary method for curing wafers in the UV curing system disclosed herein will now be presented with reference to FIGS. 1 and 3. FIG. 3 is a high level flow chart showing the basic UV curing process. In this embodiment, processing chamber 101 is operated under a vacuum.

A wafer W is first loaded through the outer access door 108 into entry load lock chamber 104A (step 200). The wafer may include a low-K insulating which requires UV curing. A vacuum is then formed in load lock chamber 104A (step 205) upon closing the outer door 108. The inner door 108 to chamber 101 may already have been closed prior to loading the wafer into load lock chamber 104A. Next, inner door 108 is opened and the wafer is loaded into processing chamber 101 and onto conveyor belt 130 by robot 106 (step 210). It should be noted that the robot 106 may also be initially used in step 200 to load the wafer into entry load lock chamber 104A. The UV lamp unit 120 and cooling gas flow are next started (step 215). Belt conveyor 131 is next operated (step 220) and the wafer is processed by UV curing as the wafer moves along with the belt 130 through the processing chamber 101 by rotating pulleys 132 (step 225). A vacuum is then formed in exit load lock chamber 104B (step 230). The outer door 108 in chamber 104B to atmosphere is already previously closed. The wafer is next removed from the processing chamber 101 and moved into exit load lock chamber 104B by robot 106 (step 235). The inner door 108 to chamber 101 is closed and outer door 108 is opened to allow the processed wafer W to be removed from load lock chamber 104B (step 240).

Figure 4:
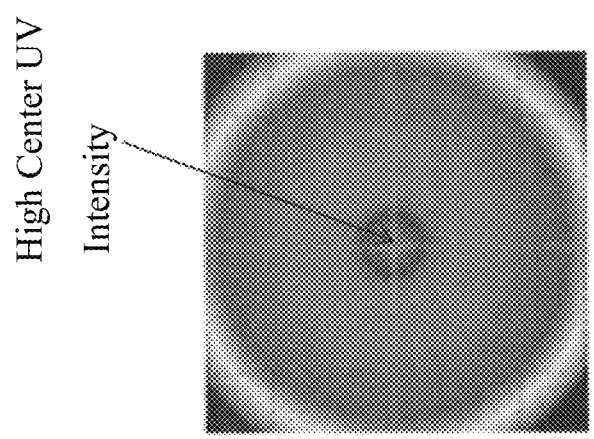
FIG. 4 is a graphical depiction of the UV irradiance or intensity levels on a wafer having a high intensity UV "hot spot" at the center of the wafer.
Figure 9:
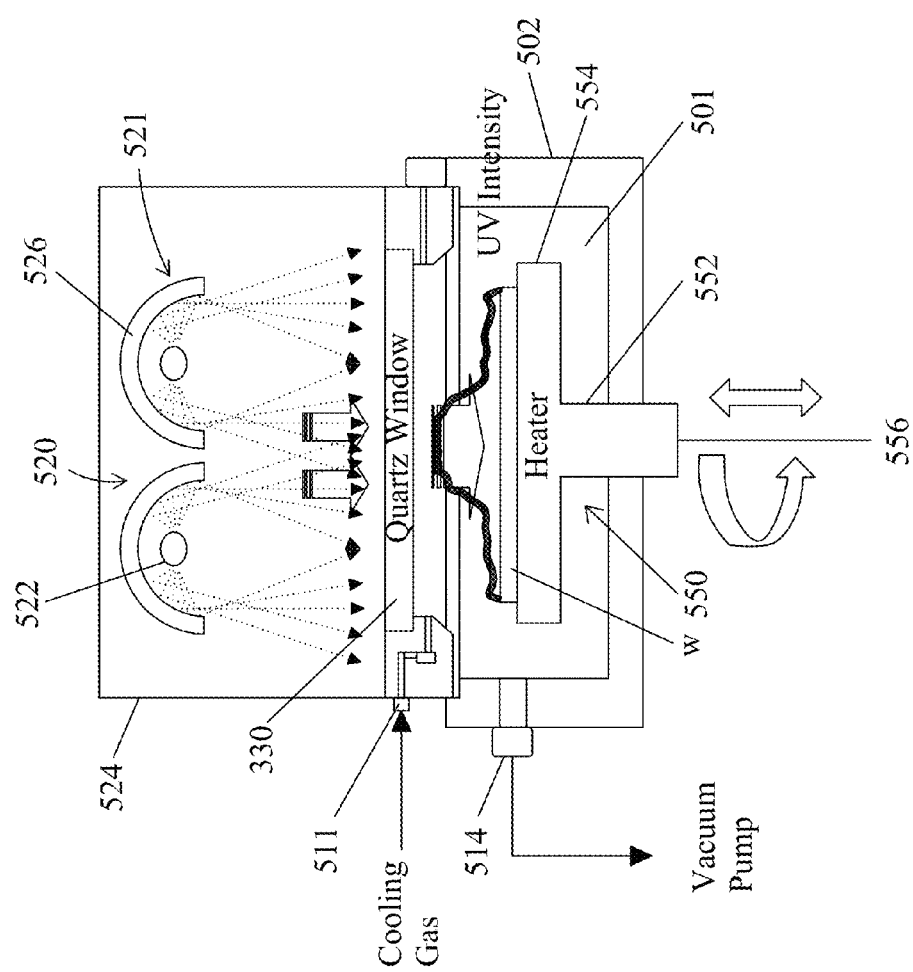
FIG. 9 is a cross-sectional elevation view of a third embodiment of a UV curing system according to the present disclosure.

FIG. 4 is a UV irradiation intensity map of a wafer undergoing curing using an embodiment of curing apparatus design such as that shown in FIG. 9 which may in some instances effectively multiply the radiation intensity on certain portions of the wafer. With this curing apparatus configuration, the center of the wafer experiences higher UV intensity than other portions of the wafer which is attributable to the lamp arrangement in which overlapping bands of UV radiation are created near the center by multiple lamps, thereby creating an additive intensity scenario. This results in disparate UV dosage and poor curing uniformity over the surface of the wafer. This central portion of the wafer exposed to greater UV intensity is further associated with higher "within wafer" shrinkage than the outer regions of the wafer, which adversely affects electric performance for devices built on the wafer within this central high shrinkage location. Although some adjustments in the reflector angle may be possible, such adjustments typically just distribute the high UV intensity dosage and shrinkage problems to other regions of the wafer and do not eliminate the problem.

Figure 5:
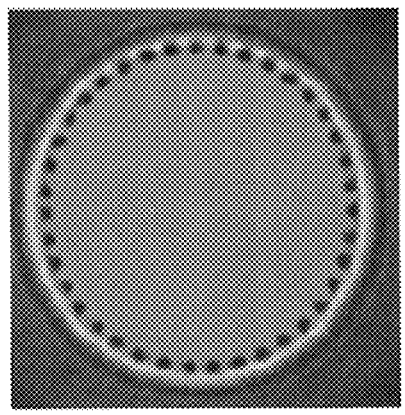
FIG. 5 is a graphical depiction of the UV irradiance or intensity levels on a wafer having a substantially uniform UV intensity level as cured using embodiments according to the present disclosure described herein.

FIG. 5 is a simulated UV irradiation intensity map of a wafer processed with the various embodiments of UV curing systems formed according to the present disclosure as described herein. In contrast to FIG. 4, more uniform curing uniformity is achieved and the high intensity area at the center of the wafer is minimized or eliminated.

Tunnel-type UV curing according to embodiments of the present disclosure with UV lamp arrays can provide the uniform UV intensity and location by moving every wafer. This results in better curing performance when compared with single wafer process tools that will cause center to edge differences in UV intensity and curing. Single wafer-based chambers cannot provide uniform UV intensity across the wafer due to the intensity always being high at the center wafer position. And hence, the wafer when fixed in a single position within the chamber of single wafer heaters suffers poor curing performance between the center and edge of the wafer.

According to one embodiment of the present disclosure, a semiconductor wafer curing system includes a processing chamber and a belt conveyor disposed in the processing chamber. The belt conveyor is configured for holding a wafer and operable to transport the wafer through the processing chamber. The system further includes an ultraviolet (UV) radiation source disposed above the processing chamber. The UV radiation source is operable to irradiate a wafer disposed on the belt conveyor for UV curing.

Second Embodiment

Figure 6:
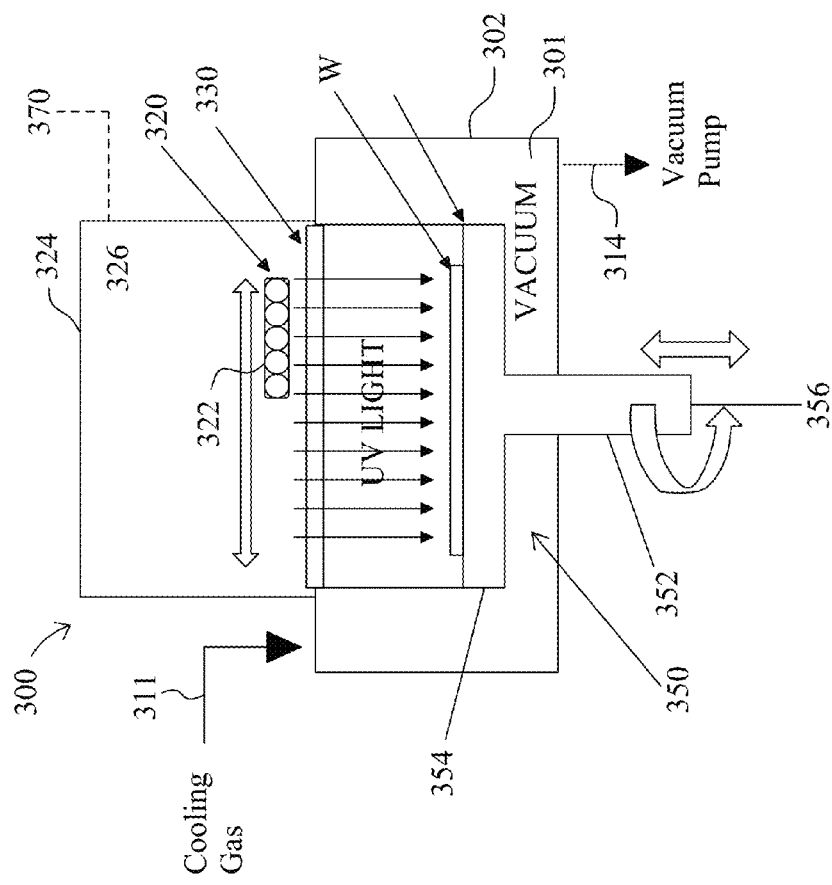
FIG. 6 is a cross-sectional elevation view of a second embodiment of a UV curing system according to the present disclosure.

FIG. 6 is a schematic diagram of an exemplary second embodiment of a UV curing system according to the present disclosure including a UV curing apparatus 300. This curing apparatus is intended to produce more uniform irradiation of the wafer and minimize or eliminate the high UV intensity dosed central wafer region shown in FIG. 4 and already described herein elsewhere.

UV curing apparatus 300 includes an enclosure 302 defining a UV irradiation processing chamber 301 therein for housing wafer W during processing, as shown in FIG. 6. In some embodiments, chamber 301 may be cylindrical or circular in configuration when viewed from above.

Curing apparatus further includes a wafer support such as heated pedestal 350 having a generally circular shaped platter 354 which is configured and structured to support the wafer. The platter 354 may be made of any suitable material capable of withstanding the temperature, pressure, and environment experienced within chamber 301 including without limitation ceramic or metal such as aluminum. Pedestal 350 further includes a shaft 352 coupled to a motor drive unit 356 which is configured and operable to raise/lower the wafer within processing chamber 301, and in some embodiments rotate the platter 354 and wafer thereon during UV processing.

With continuing reference to FIG. 6, curing apparatus 300 includes a gas inlet conduit 311 and gas outlet conduit 314 which fluidly communicate with processing chamber 301 for supplying and removing an inert cooling/purge gas to the chamber, as further described herein elsewhere. Cleaning gas for periodic removal of accumulated organic or other products from inside chamber 301 may be introduced and remove through conduits 311 and 314, respectively, or alternatively may be supplied through separate single or multiple flow nozzles 110 similar to those already described herein (see FIG. 1). O2 sensors 112 similar to those described elsewhere herein (see FIG. 1) may also be provided.

In some embodiments, gas outlet conduit 314 may be connected to a vacuum source such as a vacuum pump for operating the curing apparatus 300 and processing chamber 301 at pressures below atmospheric. In various embodiments, the processing chamber 301 may be held at a vacuum, atmospheric, or positive pressures.

Figure 7:
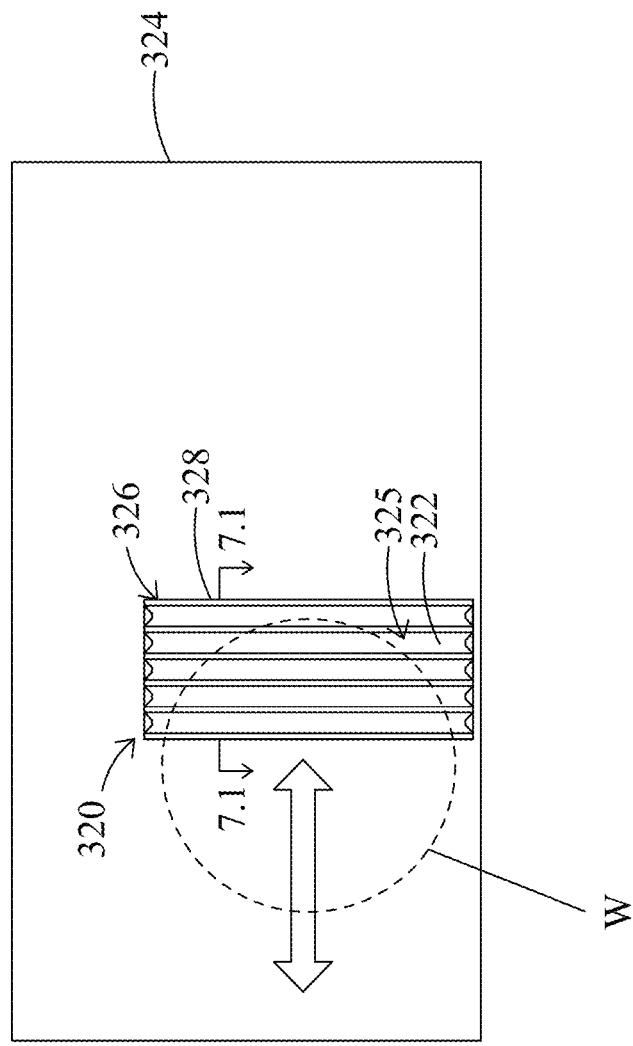
FIG. 7 is a top view of curing system of FIG. 6 showing the UV lamp unit.
Figure 8:
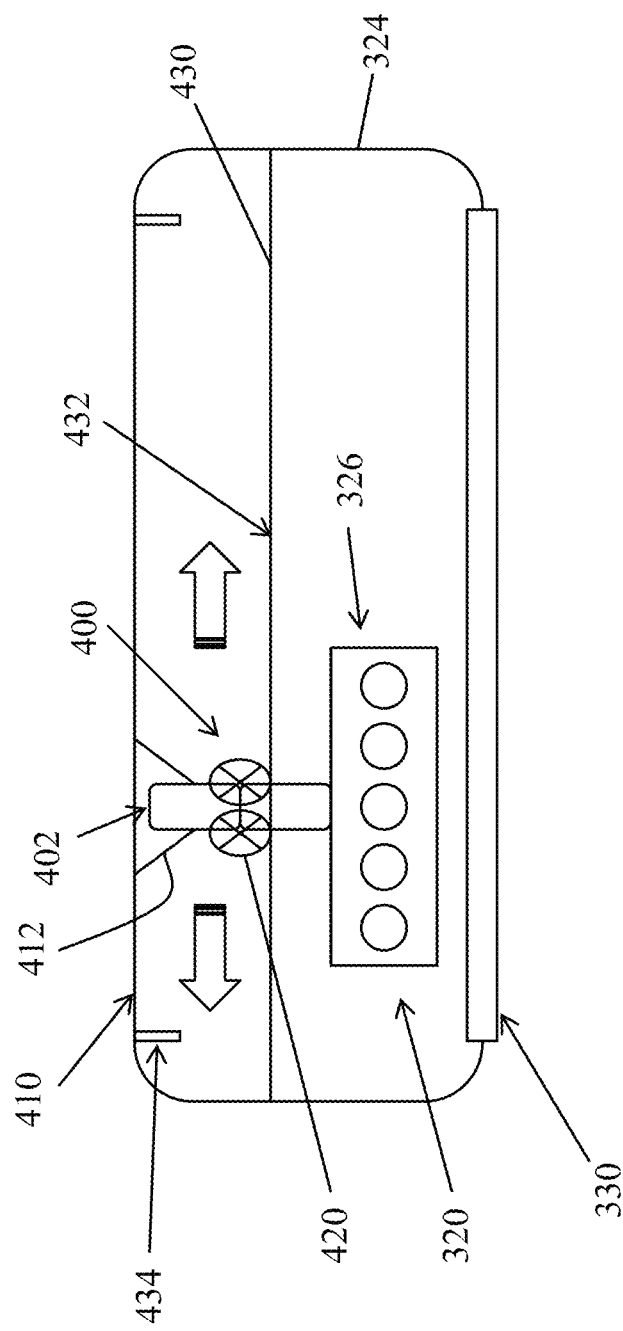
FIG. 8 shows details of the UV lamp unit movable carriage

Referring to FIGS. 6-8, a UV lamp unit 320 is provided which includes a plurality or array of UV lamps 322 supported by a movable tray or carriage 326 which scans and travels axially back and forth within a lamp housing 324 positioned above processing chamber 301. The lamp unit 320 correspondingly travels back and forth across the wafer W below during UV processing to produce more uniform UV intensity and prevention or minimization of localized high intensity regions as shown in FIG. 4 and described herein. Lamp unit 320 further includes one or more reflectors 325 for directing the UV radiation downwards towards the wafer in processing chamber 301. Reflectors 325 and lamps 322 are fixed in the lamp unit 320 and movable therewith in one embodiment.

FIG. 7.1 is a cross-sectional view of the movable lamp unit 320 in FIG. 7 showing lamps 322 and reflectors in greater detail. Reflectors 325 may be arcuately curved or parabolic shaped in some embodiments as shown and configured to reflect UV light downwards towards processing chamber 301 as shown in FIG. 6. In the embodiment shown, each lamp 322 has an associated reflector 325. FIG. 7.2 is a perspective view of the movable lamp unit 320. Any suitable number of lamps 322 and reflectors 325 may be provided so long as the wafer W in processing chamber 301 may be satisfactorily and properly irradiated in a uniform manner. Accordingly, at least one lamp 322 is provided.

A UV transparent window such as quartz window 330, which may be similar to window 130 described herein in some embodiments, separates and isolates the active wafer processing chamber 301 and UV lamp unit 320, but allows UV wavelength radiation to pass through to wafer W. Quartz window 330 is therefore positioned and seated in the curing apparatus 300 above the wafer W to operatively seal the processing chamber 301 from the ambient environment and UV lamp unit.

FIG. 7 is a top view of lamp unit 320. FIG. 8 shows the lamp carriage 326 and means for providing movement to the carriage 326 in further detail. Referring to FIGS. 6-8, carriage 326 includes a frame 328 configured for supporting the lamps 322 and associated reflectors 325 in a movable manner. In one embodiment, carriage 326 moves in a horizontal direction and plane generally parallel to the upper surface of the wafer W.

Referring to FIG. 8, a drive system is provided for moving lamp carriage 326 back and forth across wafer W and processing chamber 301. In one embodiment, lamp carriage 326 is supported from and hangs at the bottom of a movable motor carrier 400 which includes an electric motor 402 and can move forward and backward along a conductive electrical trail 410 mounted in lamp housing 324. The motor 402 and motor carrier 400 receives power and control signals from the electrical trail for adjustable speed travel by the motor carrier 400 and frequency of moving forward and backward within the lamp housing over wafer W during UV processing. Suitable electrical contacts 412 are provided to establish an electrical and signal path between trail 410 and motor carrier 400.

A controller 370 is provided that is associated with lamp unit 320 for controlling the operation, scanning or travel speed, frequency of scanning, and timing of lamp carriage 326 in its movement back and forth across the wafer W during UV curing. Controller 370 is configured with appropriate control circuits, processors, data storage, memory, input/output, power supply, and other necessary components to control the operation of lamp carriage 326 and lamps 322 supported thereon. In various embodiments controller 370 synchronizes the operation of the lamp carriage 326 and lamps 322 actuation (e.g. on/off) with overall operation of the curing apparatus 300 and UV curing cycle. The frequency and speed with which carriage 326 moves back and forth above wafer W in lamp housing 324 is adjustable via programming and/or adjustment of controller 370.

In one embodiment, referring to FIG. 8, lamp unit 320 including lamp carriage 326 is suspended from motor carrier 400 which can move forward and backward by a gear moving transfer system, which could be a metal chain or gear set 420 to transmit torque and rotation powered by motor 402 or alternatively a step-motor. In some embodiments, gear set 420 may include rotatable gears mounted on motor carrier 400 which travels back and forth along a horizontally extending gear rack disposed in lamp housing 324 over processing chamber 301. Any suitable drive system for moving motor carrier 400 back and forth may be provided. A portion of the movable motor carrier 400 or a bracket mounted thereto extends downward through an elongated horizontal slot 432 formed in a horizontally oriented partition plate 430 disposed inside in lamp housing 324 for attachment to frame 328 of lamp carriage 326. Slot 432 has a length suitable to provide the full range of linear travel desired for lamp unit 3320 to provide effective and uniform wafer UV irradiation. The chain or gear rack components may be mounted on or proximate to partition plate 430 along slot 432 in some embodiments. A travel stop 434 may be disposed proximate to each opposing end of slot 432 as shown to limit the range of linear motion for motor carrier 400 and correspondingly lamp carriage 326. In addition, controller 370 in some embodiments can also provide control for a a cooling system (not shown) as is known in the art, including gas-cool or liquid-cool, to cool down the UV lamp module for dissipating heat generated by energizing the UV bulbs.

In operation, the lamp carriage 326 is scans or moves linearly above and across the processing chamber 301 and top of wafer W, thereby incrementally irradiating the wafer a portion at a time with UV radiation as shown in FIG. 6 as the carriage moves. Advantageously, this wiper-type curing action uniformly irradiates all portions of the wafer to minimize or eliminate UV high intensity "hot spots" on the wafer which are prone to shrinkage and consequent device problems. In some embodiments, a single pass over the wafer may be sufficient to cure the dielectric film on the wafer. In other embodiments, multiple passes back and forth across the wafer may be used.

In one embodiment, referring to FIGS. 6-8, the combination of reflectors 325 and lamps 322 carried by carriage 326 produce a corresponding moving UV irradiance pattern below in chamber 301 (see downwards UV ray arrows) that scans and covers a majority of the platter 354, and more particularly at least the portions of the platter on which the wafers will be emplaced so that all portions of the wafer are irradiated substantially uniformly with relative uniform UV intensity. In some embodiments, the UV irradiance pattern forms a generally moving rectilinear (e.g. rectangular or square) irradiance illumination profile across the platter 354, which is at least the same size or larger in the horizontal plane than the platter to ensure all portions of the wafer are properly cured.

According to one embodiment of the present disclosure, a semiconductor wafer curing system includes a processing chamber, a wafer support configured for supporting a wafer in the processing chamber, and a movable ultraviolet (UV) lamp unit disposed above the processing chamber and emitting UV radiation. The UV lamp unit is operable to irradiate a wafer disposed on the wafer support, and is configured for travelling across the wafer support during a UV curing cycle to irradiate the wafer. The UV lamp unit is spaced vertically above and apart from the wafer as the unit travels across the wafer. In one embodiment, the lamp unit is a carriage supporting a plurality of UV lamps.

Third Embodiment

Figure 10:
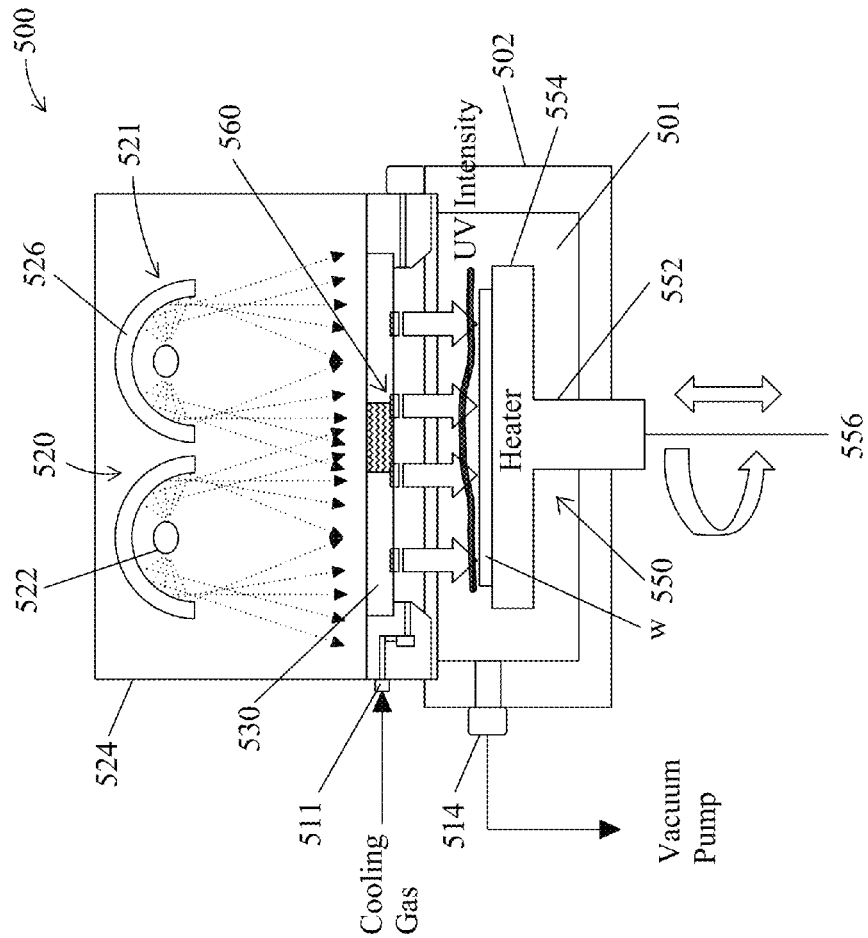
FIG. 10 is a cross-sectional elevation view of a modified version thereof.

FIG. 10 is a schematic diagram of an exemplary third embodiment of a UV curing system according to the present disclosure including a UV curing apparatus 500. In this embodiment, the quartz window 530 is modified as further described herein to produce more uniform irradiation of the wafer and minimize or eliminate the high UV intensity dosed central wafer region shown in FIG. 4 and already described elsewhere herein.

FIGS. 9 and 10 shows a similar curing apparatus 500, with modification of the quartz window 530 as further explained herein.

Referring to FIGS. 9 and 10, a UV curing apparatus 500 includes an enclosure 502 defining a UV irradiation processing chamber 501 therein for housing wafer W during processing, as shown in FIG. 10. In an embodiment, chamber 501 is cylindrical in configuration having a circular shape when viewed from above. Curing apparatus 500 further includes a wafer support such as heated pedestal 550 having a generally circular shaped platter 554 which is configured and structured to support the wafer. The platter 554 may be made of any suitable material capable of withstanding the temperature, pressure, and environment experienced within chamber 301 including without limitation ceramic or metal such as aluminum. Pedestal 550 further includes a shaft 552 coupled to a motor drive unit 556 which is configured and operable to raise/lower the wafer within processing chamber 510, and in some embodiments rotate the platter 554 and a wafer W thereon during UV processing (see directional motion arrows).

With continuing reference to FIGS. 9 and 10, curing apparatus 500 includes a gas inlet conduit 511 and gas outlet conduit 514 which fluidly communicate with processing chamber 501 for supplying and removing an inert cooling/ purge gas to the chamber, as further described herein elsewhere. Cleaning gas for periodic removal of accumulated organic or other products from inside chamber 501 may be introduced into and removed through conduits 511 and 514, respectively, or alternatively may be supplied through separate single or multiple flow nozzles 110 similar to those already described herein (see FIG. 1). O2 sensors 112 similar to those described elsewhere herein (see FIG. 1) may also be provided.

In some embodiments, gas outlet conduit 514 may be connected to a vacuum source such as a vacuum pump for operating the curing apparatus 500 and processing chamber 501 at pressures below atmospheric. In various embodiments, the processing chamber 501 may be held at a vacuum, atmospheric, or positive pressures.

Figure 11:
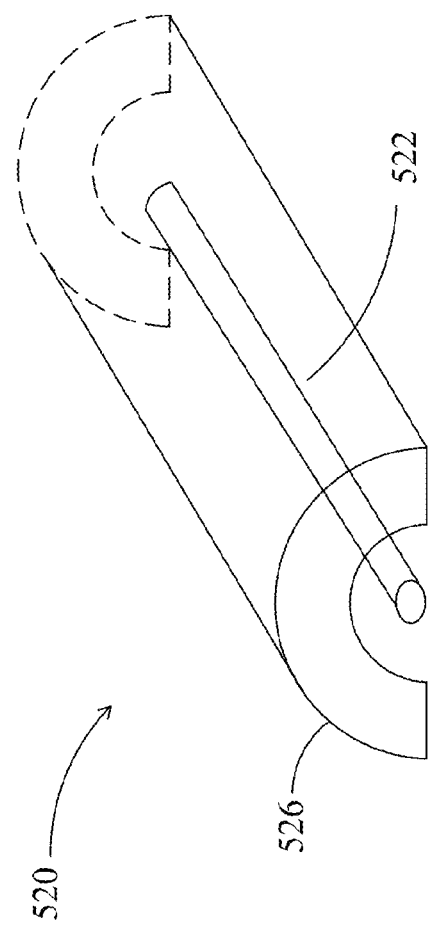
FIG. 11 is a perspective view of a lamp unit of FIGS. 9 and 10.

Referring to FIGS. 9 and 10, a UV lamp unit 520 is provided which includes a plurality or array of UV bulbs or lamps 522 and reflectors 526 positioned in lamp housing 524 located above processing chamber 501. Lamps 522 and reflectors 526 are configured and arranged to direct UV radiation downwards towards wafer W in processing chamber 501. In an embodiment, each reflector 526 is parabolic or U-shaped having a generally concave inner surface that at least partially surrounds UV lamp 522 and extends over top at least a portion of the lamp. Reflectors 526 and lamps 522 are elongated in some embodiments as best shown in FIG. 11 and arranged across processing chamber 501 in side-by-side relationship.

Lamps 522 may be similar to lamps 122 as already described herein, and in some embodiments are elongated tube-shaped lamps. In the embodiments shown in FIGS. 9-11, two lamp assemblies 521 each having a lamp 522 with its own dedicated reflector 526 are provided having a length extending longitudinally across processing chamber 510 (i.e. in a direction into the paper in FIGS. 9 and 10). In various other embodiments contemplated, more than one lamp 522 or an array of lamps 522 in any appropriate arrangement are provided for each lamp assembly 521. Any suitable arrangement, type, and/or number of lamps and reflectors may be provided, as appropriate for a given application. Thus embodiments according to the present disclosure are not limited to those depicted and described herein.

Referring now to FIG. 9, a UV transparent window such as a quartz window 530, is provided which separates and isolates the active wafer processing chamber 501 and UV lamp unit 520, but allows UV wavelength radiation from lamps 522 to pass through to wafer W. Quartz window 530 is therefore positioned and seated in the curing apparatus 500 above the wafer W to operatively seal the processing chamber 501 from the ambient environment and UV lamp unit 522. Window 530 may be mounted in an upper central portion of enclosure 502 over platter 554 which supports wafer W. In some embodiments, window 530 may be similar to window 330 already described herein, and made of synthetic quartz in an embodiment. In the embodiment shown in FIG. 9, quartz window 530 has a circular shape that complements the circular configuration of processing chamber 501.

In one embodiment, referring to FIGS. 9 and 10, the combination of reflectors 526 and lamps 522 produce a corresponding UV irradiance pattern below in chamber 501 (see downwards UV ray arrows) that covers a majority of the platter 554, and more particularly at least the portions of the platter on which the wafers will be emplaced so that all portions of the wafer are irradiated substantially uniformly with relative uniform UV intensity. In some embodiments, the UV irradiance pattern forms a generally circular or elliptical irradiance illumination profile across the platter 354, which is at least the same size or larger in the horizontal plane than the platter to ensure all portions of the wafer are properly cured. In various other embodiments, the irradiance illumination profile may be rectilinear shaped.

In FIG. 9, the UV radiation striking wafer W near the central portion of the wafer (i.e. at and proximate to the geometric center of the wafer) is amplified or multiplied by collimated converging and crossing UV rays 561 (see dashed arrows and also FIG. 13) generated by each of the two lamp assemblies 521 shown in this embodiment. As already described herein, this produces an additive irradiation effect in which the central portion of the wafer is irradiated with a higher UV intensity than outer peripheral regions of the wafer (see representative UV intensity graph overlaid on FIG. 9). This central portion of the wafer experiences higher shrinkage as already explained herein, which adversely affects the electrical performance of IC devices built in that central area.

To address the foregoing high UV intensity situation, the inventors have discovered that modifying the optical properties of a predetermined portion(s) of the quartz window associated with the high intensity reduces or eliminates the converging additive UV ray effect, thereby producing more normalized and uniform UV intensity levels across the entire surface of the wafer.

Referring to FIG. 10, a quartz window 530 is provided having a UV radiation modifier 560 which operates to produce a diverging UV ray pattern, thereby redirecting the incident converging UV rays on the modifier before they reach the wafer W below to eliminate or minimize the high UV intensity "hot spots" in the central region of the wafer. As the term is used herein, "UV radiation modifier" includes any device or substance that is operable to alter the intensity and/or direction of UV wavelength radiation.

Figures 12, 13:
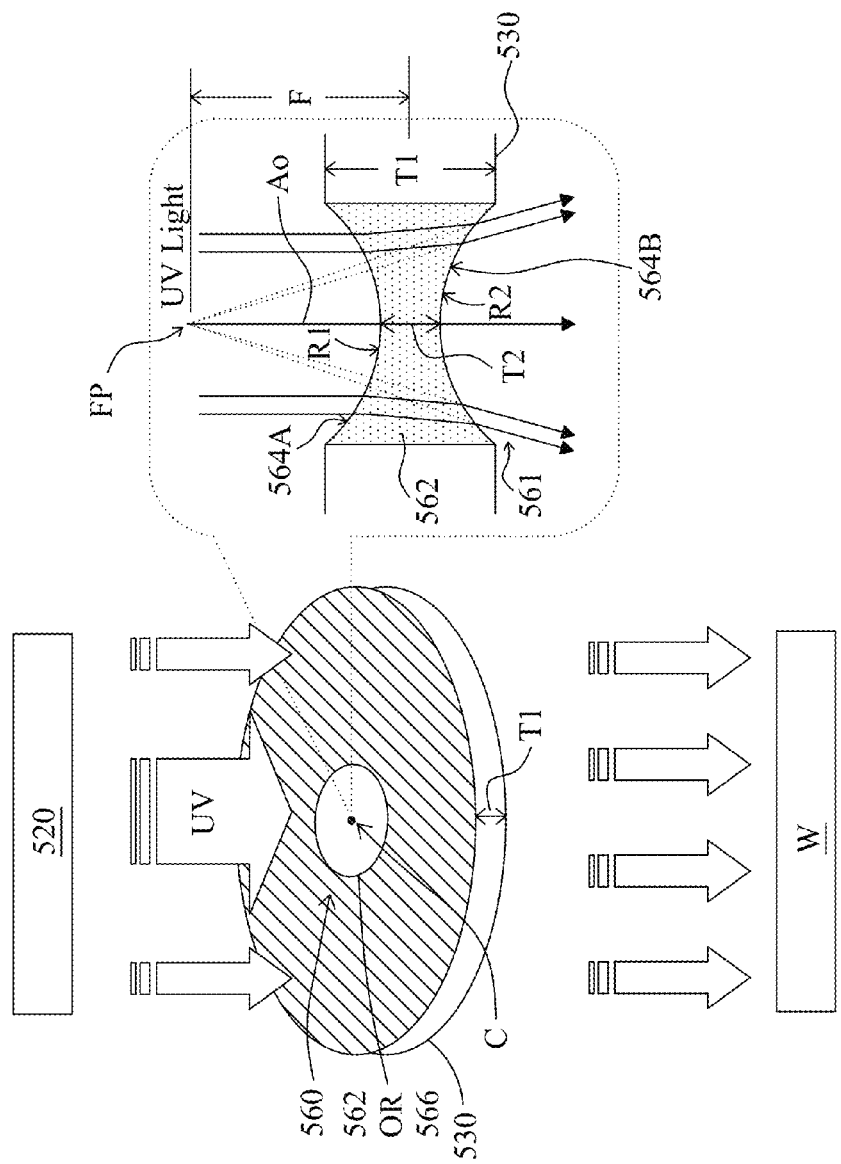
FIG. 12 is a drawing showing the UV transparent window of FIG. 10 and relative UV irradiation levels or intensities above and below the window.
FIG. 13 is an enlarged detailed elevation view of a UV radiation modifier of FIGS. 10 and 12 in the form of a negative or diverging optical lens.

With additional reference to FIGS. 12 and 13, in one embodiment UV radiation modifier 560 is in the form of a negative or diverging lens 562 which is mounted to or formed integrally with quartz window 530. Diverging lens 562 is located at the geometric center of quartz window 530 in the embodiment shown; however, one or more lenses 562 may be provided at any location(s) in window 530 where needed to redirect converging UV rays from lamp unit 520 which are associated with causing high UV intensity regions on the wafer W. Diverging lens 562 is circular in configuration in the embodiment shown and has a suitable diameter selected to minimize or eliminate the high UV intensity situation. In other embodiments contemplated, lens 562 may have other suitable configurations depending on the shape of quartz window 530 and/or the locations of the high UV intensity areas encountered.

In various embodiments, diverging lens 562 may be a biconcave lens as best shown in FIG. 13, or alternatively a plano-concave. Such lenses and their optical functionality are well known to one of ordinary skill in the art.

Referring to FIGS. 10-13, a diverging lens 562 configured as a biconcave lens is shown having an upper concave surface 564A and lower concave surface 564B. Alternatively, upper surface 564A would be flat if a plano-concave lens were instead provided. The arrangement of lens 562 shown results in a thinned center of the lens having a minimum thickness T2 which is less than the thickness T1 of adjacent portions of the quartz window 530. In some embodiments, window 530 may have a substantially uniform thickness T1 from central portions proximate to lens 562 to the peripheral edges of the window. In some representative embodiments, for illustration only without limitation, thickness T2 of lanes 562 may be about 0.5 cm to about 1 cm and thickness T1 of quartz window 530 may be about 3 cm.

Diverging lens 562 may have any suitable refractive index for the given application. In one embodiment, diverging lens 562 may be formed as an integral unitary structural portion of the monolithic quartz window 530 itself. In such a case, the lens 562 may be formed while fabricating quartz window 530 and/or the lens may be ground into the window thereafter using well known lens grinding equipment and techniques. Lens surfaces of lens 562 may be polished like a conventional optical lens in some embodiments. In alternative embodiments, diverging lens 562 may be formed separately from quartz window 530 as a discrete component and thereafter mounted or attached to the window by any suitable means including without limitation adhesives, shrink fitting, heat welding, etc. In some embodiments, as shown in FIGS. 10-13, diverging lens 562 may be formed in or incorporated into window 530 so that the lens is at least partially embedded into the window.

Referring to FIG. 13, diverging lens 562 defines an optical axis Ao, focal point FP, and a focal length F measured from focal point FP to the center of the lens between upper and lower surfaces 564A and 564B. Upper surface 564A has a radius of curvature R1 and lower surface 564B has a radius of curvature R2. Radiuses R1 and R2 are predetermined and selected to provide an appropriate focal point FP and length F as needed to produce a divergent pattern for incident UV rays 561 based on the angle of incidence of the rays on lens 562 that is sufficient to eliminate or reduce the high UV intensity to tolerable levels that do not adversely affect IC device performance. It is well within the ambit of one skilled in the art to determine these lens parameters based on the arrangement of the UV lamp unit 520 encountered.

In operation, the UV rays 561 incident on and refracted through diverging lens 562 will have a dispersed and outwardly divergent pattern as illustrated in FIG. 13 to avoid the amplification or multiplication effect of UV radiation from lamp unit 520. This will, in turn, produce a more uniform distribution of UV intensity over the entire surface of the wafer W as shown in FIG. 12 (see also representative UV intensity graph overlaid on FIG. 10), thereby eliminating or minimizing the wafer shrinkage problems and increasing device yield.

It will be appreciated that any suitable type or configuration of diverging lens 562 may be provided and integrated into quartz window 530 so long as the high UV intensity area at the center of wafer W may be eliminated or minimized.

Instead of redirecting the converging UV rays away from the center of the quartz window in the embodiment shown and described in FIGS. 12 and 13 above, another embodiment of a UV radiation modifier 560 is provided according to the present disclosure by applying a UV light absorbing optical coating 566 directly onto an upper surface of quartz window 530 facing light unit 520 (as alternatively shown in FIG. 12). The UV light absorbing coating may be applied to one or more portions of the window 530 as needed that correspond to high UV intensity locations experienced on the wafer W below. In one embodiment, UV light absorbing coating 566 may be applied proximate to the center C of the window 530 (see, e.g. FIG. 12) similarly to the portion occupied by diverging lens 562, and/or at a single or multiple other off-center locations on the window depending on where the coating is needed to reduce the UV intensity on the wafer below. The extent of surface area occupied by coating 566 and the configuration of the coated regions on quartz window 530 may be selected depending on the corresponding extent of the high UV intensity areas on the wafer encountered. In general, it will be appreciated that the surface area occupied by any of the UV radiation modifiers 560 described herein (i.e. diverging lens 562 or coating 566) will be less than the total surface area of the quartz window 530 (see, e.g. FIG. 12).

Suitable materials for UV light absorbing coating include, without limitation, TiO2 (titanium dioxide), Al2O3 (alumina), dielectric SiON, TiNi, TiON and others. These materials effectively absorb some of the UV light or radiation, but allow a portion of the UV radiation or rays to pass through window 530 to wafer W below. Since the amount of UV radiation absorbed depends on the thickness of the coating 566, an appropriate thickness for the coating may be selected based on the incident UV intensity levels on the window 530 and the amount of UV radiation to needed to be blocked/captured by the coating to produce substantially uniform irradiation of the wafer thereby eliminating or minimizing "hot spots."

In some representative examples, without limitation, UV light absorbing coating 566 may have a thickness in the range from about 10 A (Angstroms) to about 1000 A based on required curing film thickness.

According to one embodiment of the present disclosure, a semiconductor wafer curing system includes a processing chamber, a wafer support configured for supporting a wafer in the processing chamber, an ultraviolet (UV) lamp unit disposed above the processing chamber and emitting UV radiation having an intensity, the UV lamp unit being operable to irradiate a wafer disposed on the wafer support, and a UV transparent window positioned between the processing chamber and UV lamp unit. The window is operable to transmit UV radiation from the lamp unit to the wafer on the wafer support. The UV transparent window further includes a UV radiation modifier that reduces the intensity of the UV radiation passing through the modifier to the wafer on the pedestal. In one embodiment, the UV radiation modifier is a diverging lens. In another embodiment, the UV radiation modifier is an UV radiation absorbing coating applied to the UV transparent window.

While the foregoing description and drawings represent exemplary embodiments of the present disclosure, it will be understood that various additions, modifications and substitutions may be made therein without departing from the spirit and scope and range of equivalents of the accompanying claims. In particular, it will be clear to those skilled in the art that various embodiments according to the present disclosure may be configured in other forms, structures, arrangements, proportions, sizes, and with other elements, materials, and components, without departing from the spirit or essential characteristics thereof. In addition, numerous variations in the exemplary methods and processes described herein may be made without departing from the present disclosure. The presently disclosed embodiments are therefore to be considered in all respects as illustrative and not restrictive, the scope of the claimed invention being defined by the appended claims and equivalents thereof, and not limited to the foregoing description or embodiments.

What is claimed is:

1. A semiconductor wafer curing system comprising:
   a processing chamber;
   a belt conveyor disposed in the processing chamber, the belt conveyor being configured for holding a wafer and operable to transport the wafer through the processing chamber;
   an ultraviolet (UV) radiation source disposed above the processing chamber, the UV radiation source being operable to emit UV radiation to irradiate a wafer disposed on the belt conveyor for UV curing;
   the processing chamber provided with a UV transparent window that is positioned between the belt conveyor and the UV radiation source, wherein the UV radiation impinges on higher and lower intensity regions on a side of the UV transparent window with higher and lower intensities of UV radiation, respectively;
   wherein the UV transparent window is configured to pass at least some of the UV radiation from the UV radiation source, through the lower intensity region, and onto the wafer on the belt conveyor;
   the UV transparent window includes a UV radiation modifying section;
   wherein the UV radiation modifying section has a surface area less than the surface area of the side of the UV transparent window and is localized to the higher intensity region of the UV transparent window, and reduces the intensity of the UV radiation passing through the radiation modifying section to the wafer on the belt conveyor; and
   wherein all portions of the wafer are irradiated substantially uniformly with relatively uniform UV intensity.

2. The wafer curing system of claim 1, wherein the processing chamber is elongated and rectilinear in configuration.

3. The wafer curing system of claim 1, further comprising an entry load lock chamber disposed proximate to a first end of the chamber and an exit load lock chamber disposed proximate to a second end of the chamber, the wafer being movable on the belt conveyor from the entry load lock chamber to the exit load lock chamber.

4. The wafer curing system of claim 1, wherein the belt conveyor includes a UV resistant belt and pulleys operable to move the belt between opposing ends of the processing chamber.

5. A semiconductor wafer curing system comprising:
a processing chamber;
a wafer support configured for supporting a wafer in the processing chamber;
a lamp housing disposed above the processing chamber;
a conductive electrical trail mounted inside the lamp housing;
a horizontally oriented partition plate disposed inside the lamp housing;
an elongated horizontal slot provided in the partition plate;
a movable motor carrier having an electric motor operable to travel along a linear path defined by the elongated horizontal slot inside the lamp housing, wherein the elongated horizontal slot having a length suitable to provide a full range of linear travel for the motor carrier, wherein the motor carrier receives power and control signals from the electrical trail; and
a movable ultraviolet (UV) lamp carriage disposed inside the lamp housing and suspended above the processing chamber from the horizontally oriented partition plate, provided at a bottom of the motor carrier and emitting UV radiation, the UV lamp carriage being operable to move forward and backward along the conductive electrical trail and irradiate the wafer disposed on the wafer support while moving forward and backward along the conductive electrical trail whereby the UV lamp carriage travels across the wafer support along the linear path during a UV curing cycle to irradiate the wafer.

6. The wafer curing system of claim 5, wherein the lamp carriage comprises a plurality of UV lamps.

7. The wafer curing system of claim 6, wherein the UV lamps are elongated tube-type lamps.

8. The wafer curing system of claim 5, further comprising a controller configured for controlling the movement of the UV lamp carriage wherein the electric motor receives power and control signals from the electrical trail.

9. The wafer curing system of claim 5, further comprising a UV transparent window positioned between the processing chamber and the UV lamp unit.

10. The wafer curing system of claim 5, wherein the motor carrier is supported by a horizontally oriented partition plate having an elongated slot disposed in the lamp housing, the lamp carriage being coupled to the motor carrier through the slot.

11. A semiconductor wafer curing system comprising:
a processing chamber;
a wafer support configured for supporting a wafer in the processing chamber;
an ultraviolet (UV) lamp unit disposed above the processing chamber and emitting UV radiation having an intensity, the UV lamp unit being operable to emit UV radiation to irradiate a wafer disposed on the wafer support; and
the processing chamber provided with a UV transparent window that is positioned between the UV lamp unit and the wafer on the wafer support, wherein the UV radiation impinges on higher and lower intensity regions on a side of the UV transparent window with higher and lower intensities of UV radiation, respectively;
wherein the UV transparent window is configured to pass at least some of the UV radiation from the UV lamp unit, through the lower intensity region, and onto the wafer on the wafer support;
wherein the UV transparent window includes a UV radiation modifying section;
wherein the UV radiation modifying section has a surface area less than the surface area of the side of the UV transparent window and is localized to the higher intensity region of the UV transparent window, and reduces the intensity of the UV radiation passing through the radiation modifying section to the wafer; and
wherein all portions of the wafer are irradiated substantially uniformly with relatively uniform UV intensity.

12. The wafer curing system of claim 11, wherein the intensity of UV radiation projected onto a portion of the wafer positioned below the UV radiation modifying section is substantially the same as the intensity of UV radiation projected onto remaining portions of the wafer.

13. The wafer curing system of claim 11, wherein the UV radiation modifying section is a diverging lens having at least one concave surface.

14. The wafer curing system of claim 13, wherein the lens has a minimum thickness that is less than a thickness of the UV transparent window proximate to the lens.

15. The wafer curing system of claim 11, wherein the UV radiation modifying section has a circular configuration and is disposed at a center of the UV transparent window.

16. The wafer curing system of claim 11, wherein the UV radiation modifying section is a portion of the UV transparent window that is coated with a UV absorbing coating.

17. The wafer curing system of claim 1, wherein the UV radiation modifying section is a diverging lens having at least one concave surface.

18. The wafer curing system of claim 1, wherein the lens has a minimum thickness that is less than a thickness of the UV transparent window proximate to the lens.

19. The wafer curing system of claim 1, wherein the UV radiation modifying section has a circular configuration and is disposed at a center of the UV transparent window.

20. The wafer curing system of claim 1, wherein the UV radiation modifying section is a portion of the UV transparent window that is coated with a UV absorbing coating.

* * * * *